(12) United States Patent
Andrews et al.

(10) Patent No.: US 8,530,915 B2
(45) Date of Patent: *Sep. 10, 2013

(54) POWER SURFACE MOUNT LIGHT EMITTING DIE PACKAGE

(75) Inventors: Peter Scott Andrews, Durham, NC (US); Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 35 days.

This patent is subject to a terminal disclaimer.

(21) Appl. No.: 13/022,365

(22) Filed: Feb. 7, 2011

(65) Prior Publication Data

US 2011/0121345 A1    May 26, 2011

Related U.S. Application Data

(60) Division of application No. 11/689,868, filed on Mar. 22, 2007, which is a continuation of application No. 10/692,351, filed on Oct. 22, 2003, now Pat. No. 7,244,965, which is a continuation-in-part of application No. 10/446,532, filed on May 27, 2003, now Pat. No. 7,264,378.

(60) Provisional application No. 60/408,254, filed on Sep. 4, 2002.

(51) Int. Cl.
*B32B 5/12* (2006.01)

(52) U.S. Cl.
USPC .............................. 257/96; 257/99; 438/108

(58) Field of Classification Search
USPC ............... 257/98, 99, E33.072; 438/108, 26, 438/28, 43
See application file for complete search history.

(56) References Cited

U.S. PATENT DOCUMENTS

| | | | |
|---|---|---|---|
| 3,443,140 | A | 5/1969 | Jensen |
| 3,760,237 | A | 9/1973 | Jaffe |
| 4,152,618 | A | 5/1979 | Abe et al. |
| 4,168,102 | A | 9/1979 | Chida |
| 4,267,559 | A | 5/1981 | Johnson et al. |
| 4,603,496 | A | 8/1986 | Latz et al. |
| 5,119,174 | A | 6/1992 | Chen |

(Continued)

FOREIGN PATENT DOCUMENTS

| | | |
|---|---|---|
| CN | 03820849 | 8/2008 |
| CN | ZL200480030943.3 | 3/2011 |

(Continued)

OTHER PUBLICATIONS

Official Action with Restriction/Election Requirement corresponding to U.S. Appl. U.S. Appl. No. 10/446,532 dated Feb. 24, 2005.

(Continued)

*Primary Examiner* — Howard Weiss
*Assistant Examiner* — Steven Rao
(74) *Attorney, Agent, or Firm* — Jenkins, Wilson, Taylor & Hunt, P.A.

(57) ABSTRACT

A light emitting die package is provided which includes a metal substrate having a first surface and a first conductive lead on the first surface. The first conductive lead is insulated from the substrate by an insulating film. The first conductive lead forms a mounting pad for mounting a light emitting device. The package includes a metal lead electrically connected to the first conductive lead and extending away from the first surface.

33 Claims, 9 Drawing Sheets

(56) References Cited

U.S. PATENT DOCUMENTS

| | | |
|---|---|---|
| 5,173,839 A | 12/1992 | Metz, Jr. |
| 5,433,295 A | 7/1995 | Murphy |
| 5,633,963 A | 5/1997 | Rickenbach et al. |
| 5,649,757 A | 7/1997 | Aleman |
| 5,785,418 A | 7/1998 | Hochstein |
| 5,789,772 A | 8/1998 | Jiang |
| 5,835,661 A | 11/1998 | Tai |
| 5,841,177 A | 11/1998 | Komoto et al. |
| 5,847,507 A | 12/1998 | Butterworth |
| 5,849,396 A | 12/1998 | Ali et al. |
| 5,851,847 A | 12/1998 | Yamanaka |
| 5,857,767 A | 1/1999 | Hochstein |
| 5,869,883 A | 2/1999 | Mehringer et al. |
| 5,903,052 A | 5/1999 | Chen et al. |
| 5,907,151 A | 5/1999 | Gramann et al. |
| 5,959,316 A | 9/1999 | Lowery |
| 5,982,090 A | 11/1999 | Kalmanash et al. |
| 5,998,925 A | 12/1999 | Shimizu et al. |
| 6,060,729 A | 5/2000 | Suzuki et al. |
| 6,124,635 A | 9/2000 | Kuwabara |
| 6,155,699 A | 12/2000 | Miller et al. |
| 6,159,033 A | 12/2000 | Oka |
| 6,180,962 B1 | 1/2001 | Ishinaga |
| 6,238,599 B1 | 5/2001 | Gelorme et al. |
| 6,274,924 B1 | 8/2001 | Carey et al. |
| 6,281,435 B1 | 8/2001 | Maekawa |
| 6,307,272 B1 | 10/2001 | Takahashi et al. |
| 6,318,886 B1 | 11/2001 | Stopa et al. |
| 6,329,706 B1 | 12/2001 | Nam |
| 6,331,063 B1 | 12/2001 | Kamada et al. |
| 6,335,548 B1 | 1/2002 | Roberts et al. |
| 6,362,964 B1 | 3/2002 | Dubhashi et al. |
| RE37,707 E | 5/2002 | Bozzini et al. |
| 6,429,513 B1 | 8/2002 | Shermer, IV et al. |
| 6,444,498 B1 | 9/2002 | Huang et al. |
| 6,456,766 B1 | 9/2002 | Shaw et al. |
| 6,457,645 B1 | 10/2002 | Gardner, Jr. |
| 6,468,821 B2 | 10/2002 | Maeda et al. |
| 6,469,322 B1 | 10/2002 | Srivasta et al. |
| D465,207 S | 11/2002 | Williams et al. |
| 6,480,389 B1 | 11/2002 | Shie et al. |
| 6,489,637 B1 | 12/2002 | Sakamoto et al. |
| 6,490,104 B1 | 12/2002 | Gleckman et al. |
| 6,492,725 B1 | 12/2002 | Loh et al. |
| 6,501,103 B1 | 12/2002 | Jory et al. |
| 6,525,386 B1 | 2/2003 | Mills |
| 6,531,328 B1 * | 3/2003 | Chen .................. 438/26 |
| 6,541,800 B2 | 4/2003 | Barnett et al. |
| 6,559,525 B2 | 5/2003 | Huang |
| 6,582,103 B1 | 6/2003 | Popovich et al. |
| 6,610,563 B1 | 8/2003 | Waitl et al. |
| 6,614,103 B1 | 9/2003 | Durocher et al. |
| 6,670,648 B2 | 12/2003 | Isokawa et al. |
| 6,672,734 B2 | 1/2004 | Lammers |
| 6,680,491 B2 | 1/2004 | Nakanishi et al. |
| 6,680,568 B2 | 1/2004 | Fujiwara et al. |
| 6,707,069 B2 | 3/2004 | Song et al. |
| 6,710,544 B2 | 3/2004 | Schliep |
| 6,759,803 B2 | 7/2004 | Sorg |
| 6,768,525 B2 | 7/2004 | Paolini et al. |
| 6,789,921 B1 | 9/2004 | Deloy et al. |
| 6,791,259 B1 | 9/2004 | Stokes et al. |
| 6,809,347 B2 | 10/2004 | Tasch et al. |
| 6,844,903 B2 | 1/2005 | Mueller-Mach et al. |
| 6,849,867 B2 | 2/2005 | Roberts et al. |
| 6,850,001 B2 | 2/2005 | Takekuma |
| 6,864,567 B2 | 3/2005 | Yu |
| 6,874,910 B2 | 4/2005 | Sugimoto et al. |
| 6,897,486 B2 | 5/2005 | Loh |
| 6,903,380 B2 | 6/2005 | Barnett et al. |
| 6,930,332 B2 | 8/2005 | Hashimoto et al. |
| 6,943,380 B2 | 9/2005 | Ota et al. |
| 6,943,433 B2 | 9/2005 | Kamada |
| 6,949,772 B2 | 9/2005 | Shimizu |
| 6,960,878 B2 | 11/2005 | Sakano et al. |
| 7,002,727 B2 | 2/2006 | Huibers |
| 7,044,620 B2 | 5/2006 | Van Duyn |
| 7,078,254 B2 | 7/2006 | Loh |
| 7,078,728 B2 | 7/2006 | Ishii et al. |
| 7,084,435 B2 | 8/2006 | Sugimoto et al. |
| 7,102,177 B2 | 9/2006 | Goh et al. |
| 7,118,262 B2 | 10/2006 | Negley |
| 7,122,884 B2 | 10/2006 | Cabahug et al. |
| 7,192,163 B2 | 3/2007 | Park |
| 7,204,631 B2 | 4/2007 | Weber et al. |
| 7,244,965 B2 | 7/2007 | Andrews et al. |
| 7,264,378 B2 | 9/2007 | Loh |
| 7,279,719 B2 | 10/2007 | Suehiro et al. |
| 7,280,288 B2 | 10/2007 | Loh |
| 7,322,732 B2 | 1/2008 | Negley |
| 7,329,399 B2 | 2/2008 | Camaro et al. |
| 7,456,499 B2 | 11/2008 | Loh et al. |
| 7,659,551 B2 | 2/2010 | Loh |
| 7,692,206 B2 | 4/2010 | Loh |
| 7,705,465 B2 | 4/2010 | Kimura et al. |
| 7,775,685 B2 | 8/2010 | Loh |
| 7,976,186 B2 | 7/2011 | Loh |
| 7,980,743 B2 | 7/2011 | Loh |
| 8,167,463 B2 | 5/2012 | Loh |
| 8,188,488 B2 | 5/2012 | Andrews |
| 8,308,331 B2 | 11/2012 | Loh |
| 2002/0084462 A1 | 7/2002 | Tamai et al. |
| 2003/0057573 A1 | 3/2003 | Sekine et al. |
| 2003/0058650 A1 | 3/2003 | Shih |
| 2003/0193083 A1 | 10/2003 | Isoda |
| 2003/0201451 A1 | 10/2003 | Suehiro |
| 2004/0004435 A1 | 1/2004 | Hsu |
| 2005/0001433 A1 | 1/2005 | Seelin |
| 2005/0093430 A1 | 5/2005 | Ibbetson et al. |
| 2005/0152146 A1 | 7/2005 | Owen et al. |
| 2005/0265029 A1 | 12/2005 | Epstein et al. |
| 2006/0083017 A1 | 4/2006 | Wang |
| 2006/0097385 A1 | 5/2006 | Negley |
| 2006/0098441 A1 | 5/2006 | Chou |
| 2006/0215075 A1 | 9/2006 | Huang et al. |
| 2006/0263545 A1 | 11/2006 | Coenjarts |
| 2006/0292747 A1 | 12/2006 | Loh |
| 2007/0054149 A1 | 3/2007 | Cheng |
| 2007/0085194 A1 | 4/2007 | Mao et al. |
| 2007/0200127 A1 | 8/2007 | Andrews |
| 2008/0231170 A1 | 9/2008 | Masato et al. |
| 2011/0186895 A1 | 8/2011 | Loh |
| 2011/0186896 A1 | 8/2011 | Loh |
| 2011/0186897 A1 | 8/2011 | Loh |
| 2011/0261554 A1 | 10/2011 | Loh |

FOREIGN PATENT DOCUMENTS

| | | |
|---|---|---|
| DE | 19945919 | 3/2000 |
| EP | 0965493 | 12/1999 |
| EP | 1059678 | 12/2000 |
| EP | 1087447 A1 | 3/2001 |
| EP | 1179858 | 2/2002 |
| EP | 1416219 | 5/2004 |
| EP | 1418628 | 5/2004 |
| EP | 1537603 | 7/2008 |
| EP | 1953825 | 8/2008 |
| EP | 1680816 | 9/2009 |
| JP | 07-202271 | 8/1995 |
| JP | H09-083018 | 3/1997 |
| JP | 09274454 | 10/1997 |
| JP | H10-098215 | 4/1998 |
| JP | 10-151804 | 6/1998 |
| JP | H10-321909 | 12/1998 |
| JP | 11-163409 | 6/1999 |
| JP | H11-177136 | 7/1999 |
| JP | 2000-013962 | 1/2000 |
| JP | 2000-101149 | 4/2000 |
| JP | 2000-236116 | 8/2000 |
| JP | 2000-277807 | 10/2000 |
| JP | 2001-036148 | 2/2001 |
| JP | 2001-044452 | 2/2001 |
| JP | 2001-052513 | 2/2001 |
| JP | 2001-111116 | 4/2001 |
| JP | 2001-144333 | 5/2001 |

| | | |
|---|---|---|
| JP | 2002-093206 | 3/2002 |
| JP | 2002-270903 | 9/2002 |
| JP | 2002-319711 | 10/2002 |
| JP | 2002-368278 | 12/2002 |
| JP | 2003-110146 | 4/2003 |
| JP | 2003-124525 | 4/2003 |
| JP | 2003-197974 | 7/2003 |
| JP | 2002103977 | 10/2003 |
| JP | 2003298117 | 10/2003 |
| JP | 2003-318448 | 11/2003 |
| JP | 2003-124528 | 5/2004 |
| JP | 4731906 | 7/2011 |
| KR | 10-1991-0007381 | 5/1991 |
| KR | 10-2001-00069 14 | 1/2001 |
| KR | 10-1082145 | 11/2011 |
| KR | 10-1082169 | 11/2011 |
| KR | 10-1082235 | 11/2011 |
| KR | 10-1082304 | 11/2011 |
| KR | 10-1088928 | 11/2011 |
| KR | 10-1160037 | 6/2012 |
| TW | 556364 | 11/2001 |
| TW | 497758 | 8/2002 |
| TW | 517402 | 1/2003 |
| TW | 518775 | 1/2003 |
| TW | 533604 | 5/2003 |
| WO | WO 99/31737 | 6/1999 |
| WO | WO 2004/023552 | 3/2004 |
| WO | WO 2005/043627 | 5/2005 |

OTHER PUBLICATIONS

Non-Final Official Action corresponding to U.S. Appl. No. 10/446,532 dated Jul. 26, 2005.
Non-Final Official Action corresponding to U.S. Appl. No. 10/446,532 dated May 2, 2006.
Official Action with Restriction/Election Requirement corresponding to U.S. Appl. No. 10/692,351 dated Oct. 5, 2004.
Non-Final Official Action corresponding to U.S. Appl. No. 10/692,351 dated Feb. 24, 2005.
Final Official Action corresponding to U.S. Appl. No. 10/692,351 dated Nov. 16, 2005.
Official Action with Advisory Action corresponding to U.S. Appl. No. 10/692,351 dated Apr. 4, 2006.
International Search Report corresponding to PCT International Application No. PCT/US03/27421 dated Nov. 10, 2004.
International Search Report corresponding to PCT International Application No. PCT/US04/34768 dated Apr. 21, 2005.
Supplemental European Search Report corresponding to EP Appl. No. 03794564.9 dated Aug. 22, 2006.
Official Action corresponding to U.S. Appl. No. 11/153,724 dated Nov. 2, 2006.
Notification of International Preliminary Report on Patentability and Written Opinion corresponding to PCT International Application No. PCT/US06/025193 dated Jan. 23, 2007, (mail date).
Supplemental European Search Report corresponding to European Patent Application No. 04795871 dated Mar. 7, 2007.
Official Action corresponding to U.S. Appl. No. 11/153,724 dated May 3, 2007.
Chinese Office Action for Appl. No. 03820849 with English translation dated Jul. 6, 2007.
Official Action corresponding to U.S. Appl. No. 11/153,724 dated Oct. 16, 2007.
Official Action corresponding to U.S. Appl. No. 11/694,046 dated Oct. 25, 2007.
International Search Report and Written Opinion for PCT/US06/025193 dated Oct. 29, 2007.
European Examination Report corresponding to European Patent Application No. 04795871.5 dated Nov. 12, 2007.
Official Action/Restriction Requirement corresponding to U.S. Appl. No. 11/168,018 dated Dec. 11, 2007.
Notification of International Preliminary Report on Patentability and Written Opinion for PCT International Application No. PCT/US06/023195 dated Jan. 3, 2008.
Notification of International Preliminary Report on Patentability and Written Opinion corresponding to PCT International Application No. PCT/US06/025193 dated Jan. 17, 2008.

Official Action corresponding to U.S. Appl. No. 11/168,018 dated Mar. 27, 2008.
Official Action corresponding to U.S. Appl. No. 11/694,046 dated May 7, 2008.
Official Action corresponding to U.S. Appl. No. 11/168,018 dated May 28, 2008.
EPO Notice of Patent Grant for EP 03794564.9 dated Jun. 12, 2008.
Final Office Action for U.S. Appl. No. 11/153,724 dated Jul. 1, 2008.
European Notice of Publication for EP 08157294 dated Jul. 9, 2008 (dated "received" on Jul. 14, 2008).
Chinese Office Action for CN 2004-80030943.3 (with English Translation) dated Jul. 4, 2008 but received Aug. 7, 2008 (incorrectly dated on some docs as "Aug. 4, 2008").
European Search Report and Written Opinion for EP 08157294.3 dated Aug. 20, 2008.
Office Action for U.S. Appl. No. 11/153,724 dated Oct. 17, 2008.
Office Action with Restriction/Election Requirement dated Oct. 20, 2008 for U.S. Appl. No. 11/689,868.
Non-final Office Action for U.S. Appl. No. 11/694,046 dated Dec. 1, 2008.
Final Office Action corresponding to U.S. Appl. No. 11/168,018 dated Dec. 10, 2008.
Chinese Office Action for CN 2004-80030943.3 with English translation dated Dec. 12, 2008.
Non-final Office Action for U.S. Appl No. 11/689,868 dated Jan. 26, 2009.
Office Action with Restriction/Election Requirement for U.S. Appl. No. 11/703,721 dated Feb. 26, 2009.
European Office Action for EP Appl. No. 08157294.3 dated Mar. 16, 2009.
Final Office Action for U.S. Appl. No. 11/153,724 dated Mar. 23, 2009.
Communication Under Rule 71(3) EPC (with enclosures) regarding intent to grant European patent for Application No. 04795871.5-222 dated Apr. 24, 2009.
Office Action (with English Summary) dated Apr. 28, 2009 regarding Japanese Patent Application No. 2004-534428.
Communication dated May 13, 2009 regarding no Opposition for European Application No. 03794564.9-2222 /Patent No. 1537603.
Official Action corresponding to Japanese Patent Application No. 2006-536764 (with English Translation) dated Jun. 9, 2009.
Official Action corresponding to U.S. Appl. No. 11/168,018 dated Jul. 7, 2009.
Official Action corresponding to U.S. Appl. No. 11/689,868 dated Jul. 17, 2009.
Notice of Allowance dated Jul. 24, 2009 regarding U.S. Appl. No. 11/694,046.
Official Action corresponding to U.S. Appl. No. 11/703,721 dated Aug. 6, 2009.
Decision to Grant from European Patent Office corresponding to European Patent Application No. 1,680,816 dated Sep. 3, 2009.
Official Action and Search Report corresponding to Taiwan Patent Application No. 092123988 dated Sep. 11, 2009 (with English Translation).
Official Action corresponding to Chinese Patent Application No. 2004800309433 (with English Translation) dated Sep. 25, 2009.
Official Action corresponding to U.S. Appl. No. 11/153,724 dated Nov. 9, 2009.
European Search Report corresponding to European Patent Application No. 09171045.9 dated Nov. 23, 2009.
Japanese Office Action (English Translation) corresponding to Japanese Patent Application No. 2006-536764 dated Feb. 2, 2010.
Japanese Office Action (English Translation) corresponding to Japanese Patent Application No. 2004-534428 dated Feb. 23, 2010.
Official Action corresponding to U.S. Appl. No. 11/168,018 dated Mar. 2, 2010.
Notice of Allowance corresponding to U.S. Appl. No. 11/703,721 dated Apr. 16, 2010.
Final Office Action corresponding to 11/153,724 dated Apr. 27, 2010.
Advisory Action corresponding to U.S. Appl. No. 11/168,018 dated May 13, 2010.
IPO (TW) Notice of Allowance corresponding to TW Patent Application No. 092123988 dated Jun. 8, 2010.

European Office Action corresponding to European Patent Application No. 09171045.9 dated Jun. 18, 2010.
Korean Patent Office Action corresponding to KR 10-2005-7003428 dated Jul. 29, 2010.
Non-Final Office Action for App. U.S. Appl. No. 12/856,320 dated Sep. 14, 2010.
Non-Final Office Action for U.S. Appl. No. 11/153,724 dated Sep. 15, 2010.
Chinese Patent Certificate dated Oct. 1, 2010 for TW Patent No. I 331380.
Japanese Notice of Issuance for JP 4602345 dated Oct. 8, 2010.
Japanese Office Action/Rejection (English Translation) corresponding to Japanese Patent Appl. No. 2004-534428 dated Oct. 19, 2010.
Chinese Notice of Patent Grant for CN Appl No. 200480030943.3 dated Oct. 29, 2010.
Notice of Allowance corresponding to U.S. Appl. No. 12/856,320 dated Mar. 3, 2011.
Japanese Notice of Allowance for JP Appl. 2004-534428 dated Mar. 29, 2011.
Notice of Allowance corresponding to U.S. Appl. No. 11/153,724 dated Apr. 14, 2011.
Taiwanese Office Action/Rejection (English Translation) corresponding to TW Patent Appl. No. 093131884 dated Apr. 15, 2011.
Korean Office Action corresponding to Korean Patent Application No. 10-2011-7002566 dated Apr. 19, 2011.
Korean Office Action corresponding to Korean Patent Application No. 10-2011-7002567 dated Apr. 20, 2011.
Korean Office Action corresponding to Korean Patent Application No. 10-2011-7002568 dated Apr. 20, 2011.
Korean Office Action corresponding to Korean Patent Application No. 10-2011-7002573 dated Apr. 22, 2011.
Non-Final Office Action for U.S. Appl. No. 11/168,018 dated May 9, 2011.
Korean Office Action corresponding to Korean Patent Application No. 10-2006-7007929 dated May 23, 2011.
Japanese Office Action for JP 2008-519523 dated Jun. 14, 2011.
Korean Office Action for Korean Application No. 10-2011-7002575 dated Jun. 2, 2011.
Non-Final Office Action for U.S. Appl. No. 13/175,600 dated Jul. 28, 2011.
Non-Final Office Action for U.S. Appl. No. 11/689,868 dated Aug. 30, 2011.
Korean Notice of Allowance for KR Appl. No. 10-2011-7002566 dated Sep. 26, 2011.
Korean Notice of Allowance for KR Appl. No. 10-2011-7002567 dated Sep. 26, 2011.
Korean Notice of Allowance for KR Appl. No. 10-2011-7002568 dated Sep. 26, 2011.
Korean Notice of Allowance for KR Appl. No. 10-2011-7002573 dated Oct. 5, 2011.
Final Office Action for U.S. Appl. No. 11/168,018 dated Oct. 13, 2011.
German Office Action for Application Serial No. DE 11 2006 001 634.2 dated Nov. 15, 2011.
Non-Final Office Action for U.S. Appl. No. 13/175,600 dated Jan. 4, 2012.
Notice of Allowance for U.S. Appl. No. 13/023,268 dated Jan. 6, 2012.
Non-Final Office Action for U.S. Appl. No. 13/023,263 dated Jan 26, 2012.
Non-Final Office Action for U.S. Appl. No. 13/023,273 dated Jan. 25, 2012.
Supplemental Notice of Allowance for U.S. Appl. No. 13/023,268 dated Feb. 1, 2012.
Notice of Allowance for U.S. Appl. No. 11/689,868 dated Feb. 8, 2012.
Corrected Notice of Allowance for U.S. Appl. No. 11/689,868 dated Mar. 5, 2012.
Notice of Allowance for U.S. Appl. No. 13/023,263 dated May 11, 2012.
Notice of Allowance for U.S. Appl. No. 13/023,273 dated May 11, 2012.
Chineese Office Action for Chineese Appl. No. 201110021262.0 dated Feb. 16, 2012.
Korean Notice of Allowance for KR Appl. No. 10-2006-7007929 dated Mar. 27, 2011.
Japanese Office Action for Application Serial No. JP 2008-519523 dated Jun. 21, 2011.
Japanese Office Action for JP 2008-519523 dated Jun. 19, 2012.
Taiwanese Office Action for Application Serial No. TW 093131884 dated Jun. 28, 2012.
Notice of Allowance for U.S. Appl. No. 13/175,600 dated Jul. 9, 2012.
Notification Regarding Oral Hearing for Application No. DE 11 2006 001 634.2 dated Sep. 20, 2012.
Chinese Office Action for Application No. 201110021562.0 dated Sep. 28, 2012.
Japanese Office Action for Application Serial No. JP 2011-032604 dated Oct. 16, 2012.
Japanese Office Action for Application Serial No. JP 2011-032598 dated Oct. 16, 2012.
Non-Final Office Action for U.S. Appl. No. 13/023,263 dated Oct. 17, 2012.
Japanese Office Action for Application Serial No. 2011-032599 dated Oct. 17, 2012.
Japanese Office Action for Application Serial No. 2011-032600 dated Oct. 17, 2012.
Japanese Office Action for Application Serial No. 2011-032601 dated Oct. 17, 2012.
Japanese Office Action for Application Serial No. 2011-032602 dated Oct. 17, 2012.
Japanese Office Action for Application Serial No. 2011-032603 dated Oct. 17, 2012.
German Oral Hearing Summary for Application Serial No. DE 11 2006 001 634.2 dated Nov. 15, 2012.
Non-Final Office Action for U.S. Appl. No. 13/481,334 dated Dec. 20, 2012.
Taiwanese Notice of Allowance for Application No. 093131884 dated Jan. 16, 2013.
Korean Notice of Allowance for Application No. 10-2006-7007929 dated Feb. 6, 2013.
European Intent to Grant for Application No. 08 157 294.3—2222 dated Feb. 6, 2013.
Korean Office Action for Application No. 10-2012-7027757 dated Feb. 14, 2013.

* cited by examiner

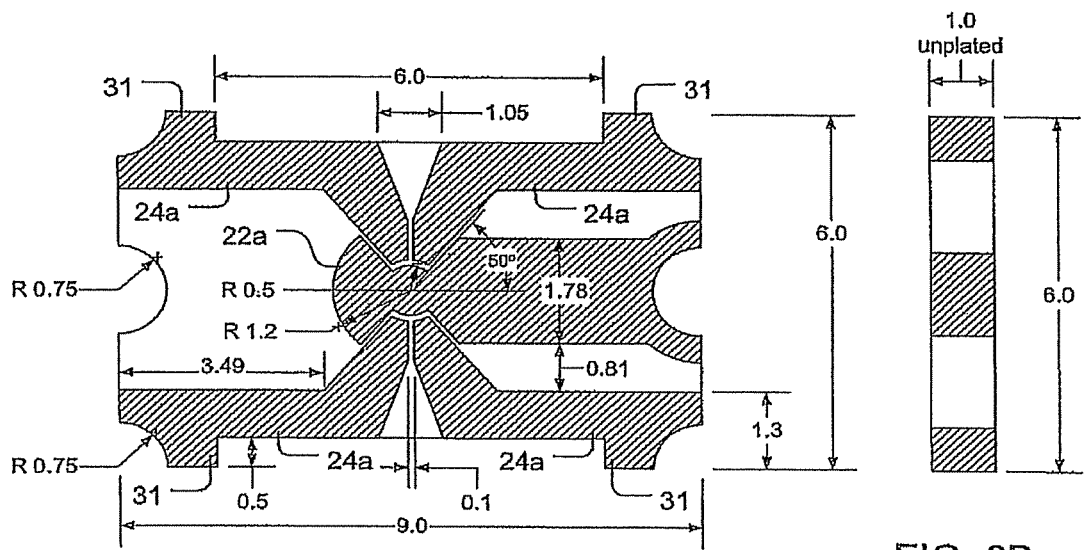
FIG. 6A
FIG. 6B
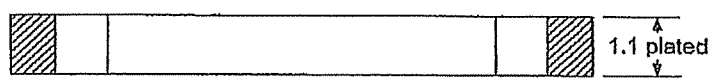
FIG. 6C
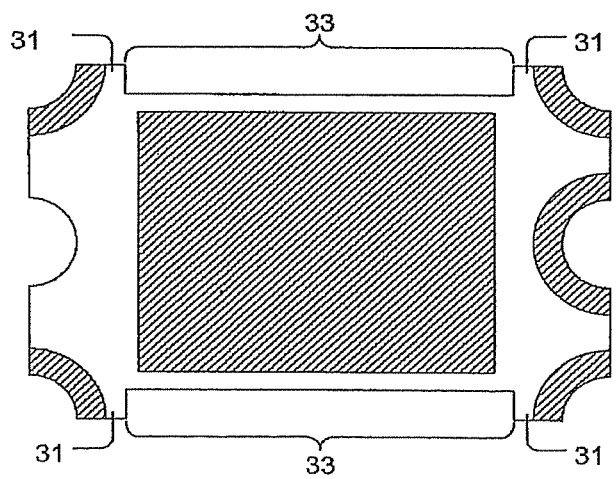
FIG. 6D

POWER SURFACE MOUNT LIGHT EMITTING DIE PACKAGE

CROSS REFERENCE TO RELATED APPLICATIONS

This application is a divisional of and claims priority to U.S. patent application Ser. No. 11/689,868 entitled "Power Surface Mount Light Emitting Die Package" filed Mar. 22, 2007, which is a continuation of U.S. patent application Ser. No. 10/692,351 entitled "Power Surface Mount Light Emitting Die Package" filed Oct. 22, 2003, now U.S. Pat. No. 7,244,965, which is a continuation-in-part of U.S. patent application Ser. No. 10/446,532 entitled "Power Surface Mount Light Emitting Die Package" filed May 27, 2003, now U.S. Pat. No. 7,264,378, which claims the benefit of U.S. Provisional Application Ser. No. 60/408,254 filed Sep. 4, 2002. The entire contents of the above applications and patents are incorporated by reference herein.

BACKGROUND

Example embodiments in general relate to packaging semiconductor devices which include light emitting diodes.

Light emitting diodes (LEDs) are often packaged within leadframe packages. A leadframe package typically includes a molded or cast plastic body that encapsulates an LED, a lens portion, and thin metal leads connected to the LED and extending outside the body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and has a small cross section. For this reason, capacity of the metal leads to remove heat from the LED is limited. This limits the amount of power that can be sent to the LED thereby limiting the amount of light that can be generated by the LED.

To increase the capacity of an LED package to dissipate heat, in one LED package design, a heat sink slug is introduced into the package. The heat sink slug draws heat from the LED chip. Hence, it increases the capacity of the LED package to dissipate heat. However, this design introduces empty spaces within the package that is be filled with an encapsulant to protect the LED chip. Furthermore, due to significant differences in CTE (coefficient of thermal expansion) between various components inside the LED package, bubbles tend to form inside the encapsulant or the encapsulant tends to delaminate from various portions within the package. This adversely affects the light output and reliability of the product. In addition, this design includes a pair of flimsy leads which are typically soldered by a hot-iron. This manufacturing process is incompatible with convenient surface mounting technology (SMT) that is popular in the art of electronic board assembly.

In another LED package design, the leads of the leadframe package have differing thicknesses extended (in various shapes and configurations) beyond the immediate edge of the LED package body. A thicker lead is utilized as a heat-spreader and the LED chip is mounted on it. This arrangement allows heat generated by the LED chip to dissipate through the thicker lead which is often connected to an external heat sink. This design is inherently unreliable due to significant difference in coefficient of thermal expansion (CTE) between the plastic body and the leadframe material. When subjected to temperature cycles, its rigid plastic body that adheres to the metal leads experiences high degree of thermal stresses in many directions. This potentially leads to various undesirable results such as cracking of the plastic body, separation of the plastic body from the LED chip, breaking of the bond wires, delaminating of the plastic body at the interfaces where it bonds to various parts, or resulting in a combination of these outcomes. In addition, the extended leads increase the package size and its footprint. For this reason, it is difficult to populate these LED packages in a dense cluster on a printed circuit board (PCB) to generate brighter light.

Another disadvantage of conventional leadframe design is that the thick lead cannot be made or stamped into a fine circuit for flip-chip mounting of a LED—which is commonly used by some manufacturers for cost-effective manufacturing and device performance.

SUMMARY

An example embodiment of the present invention is directed to a light emitting die package. The package includes a substrate having a first surface and a first conductive lead on the first surface that is insulated from the substrate by an insulating film. The first conductive lead forms a mounting pad for mounting a light emitting device. The package includes a lead electrically connected to the first conductive lead and extending away from the first surface.

Another example embodiment is directed to a light emitting die package. The package includes a substrate having a first surface and a second surface opposite the first surface, a via hole through the substrate, and a conductive lead extending from the first surface to the second surface. The conductive lead is insulated from the substrate by an insulating film. The package includes a metal contact pad on one of the first and second surfaces electrically connected to the conductive lead. The metal contact pad has a light emitting diode (LED) mounted thereon.

Another example embodiment is directed to a LED package including a substrate having a first surface, a second surface opposite the first surface, and a first conductive lead on the first surface that is insulated from the substrate by a first insulating film. The first conductive lead forms a mounting pad for mounting a light emitting device. The package includes at least one via hold formed through the substrate. A surface of the via hole is coated with a second insulating film.

Another example embodiment is directed to a LED package including a substrate having a top surface, a bottom surface, at least one conductive element on the top surface connected to a LED and at least one conductive element attached to the bottom surface. The package includes at least two via, holes formed through the substrate. Each via hole includes an electrical conductor therein which electrically connects the at least one conductive elements on the top and bottom surfaces of the substrate.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limitative of the example embodiments.

FIG. 6A is a top view of a portion of the semiconductor package of FIG. 5.

FIG. 6B is a side view of a portion of the semiconductor package of FIG. 5.

FIG. 6C is a front view of a portion of the semiconductor package of FIG. 5.

FIG. 6D is a bottom view of a portion of the semiconductor package of FIG. 5.

DETAILED DESCRIPTION

Example embodiments will now be described with reference to FIGS. 1 through 10B. As illustrated in the Figures, the sizes of layers or regions are exaggerated for illustrative purposes and, thus, are provided to illustrate the general structures of the present invention. Furthermore, various aspects in the example embodiments are described with reference to a layer or structure being formed on a substrate or other layer or structure. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate.

Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

As shown in the figures for the purposes of illustration, example embodiments of the present invention are exemplified by a light emitting die package including a bottom heat sink (substrate) having traces for connecting to a light emitting diode at a mounting pad and a top heat sink (reflector plate) substantially surrounding the mounting pad. A lens covers the mounting pad. In effect, an example die package comprises a two part heat sink with the bottom heat sink utilized (in addition to its utility for drawing and dissipating heat) as the substrate on which the LED is mounted and connected, and with the top heat sink utilized (in addition to its utility for drawing and dissipating heat) as a reflector plate to direct light produced by the LED. Because both the bottom and the top heat sinks draw heat away from the LED, more power can be delivered to the LED, and the LED can thereby produce more light.

Further, the body of the die package itself may act as the heat sink removing heat from the LED and dissipating it. For this reason, the example LED die package may not require separate heat sink slugs or leads that extend away from the package. Accordingly, the LED die package may be more compact, more reliable, and less costly to manufacture than die packages of the prior art.

Figure 1A:
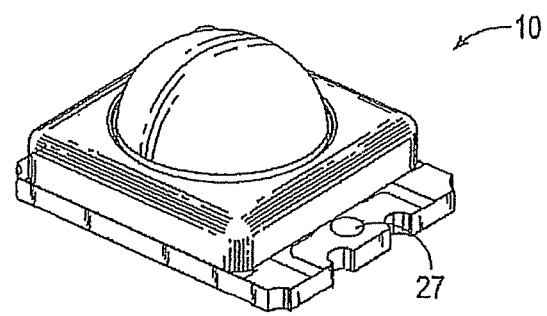
FIG. 1A is a perspective view of a semiconductor die package according to one embodiment of the present invention.
Figure 1B:
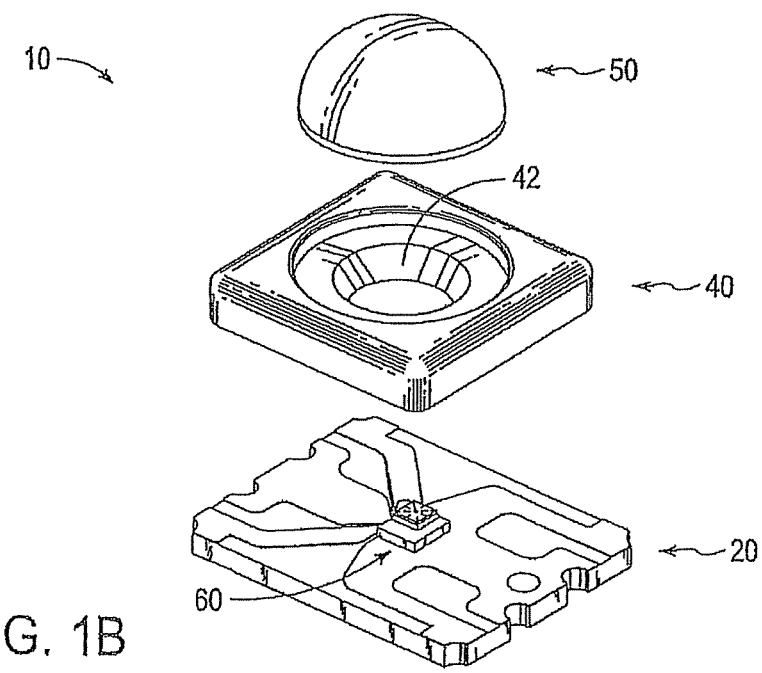
FIG. 1B is an exploded perspective view of the semiconductor package of FIG. 1A.

FIG. 1A is a perspective view of a semiconductor die package 10 according to one embodiment of the present invention and FIG. 1B is an exploded perspective view of the semiconductor package of FIG. 1A. Referring to FIGS. 1A and 1B, the light emitting die package 10 of the present invention includes a bottom heat sink 20, a top heat sink 40, and a lens 50.

The bottom heat sink 20 is illustrated in more detail in FIGS. 2A through 2D. FIGS. 2A, 2B, 2C, and 2D provide, respectively, a top view, a side view, a front view, and a bottom view of the bottom heat sink 20 of FIG. 1A. Further, FIG. 2C also shows an LED assembly 60 in addition to the front view of the bottom heat sink 20. The LED assembly 60 is also illustrated in FIG. 1B. Referring to FIGS. 1A through 2D, the bottom heat sink 20 provides support for electrical traces 22 and 24; for solder pads 26, 32, and 34; and for the LED assembly 60. For this reason, the bottom heat sink 20 is also referred to as a substrate 20. In the Figures, to avoid clutter, only representative solder pads 26, 32, and 34 are indicated with reference numbers. The traces 22 and 24 and the solder pads 32, 34, and 36 can be fabricated using conductive material. Further, additional traces and connections can be fabricated on the top, side, or bottom of the substrate 20, or layered within the substrate 20. The traces 22 and 24, the solder pads 32, 34, and 36, and any other connections can be interconnected to each other in any combination using known methods, for example via holes.

The substrate 20 is made of material having high thermal conductivity but is electrically insulating, for example, aluminum nitride (AlN) or alumina (Al.sub.2O.sub.3). Dimensions of the substrate 20 can vary widely depending on application and processes used to manufacture the die package 10. For example, in the illustrated embodiment, the substrate 20 may have dimensions ranging from fractions of millimeters (mm) to tens of millimeters. Although the present invention is not limited to particular dimensions, one specific embodiment of the die package 10 of the present invention is illustrated in Figures with the dimensions denoted therein. All dimensions shown in the Figures are in millimeters (for lengths, widths, heights, and radii) and degrees (for angles) except as otherwise designated in the Figures, in the Specification herein, or both.

The substrate 20 has a top surface 21, the top surface 21 including the electrical traces 22 and 24. The traces 22 and 24 provide electrical connections from the solder pads (for example top solder pads 26) to a mounting pad 28. The top solder pads 26 are portions of the traces 22 and 24 generally proximal to sides of the substrate 20. The top solder pads 26 are electrically connected to side solder pads 32. The mounting pad 28 is a portion of the top surface (including portions of the trace 22, the trace 24, or both) where the LED assembly 60 is mounted. Typically the mounting pad 28 is generally located proximal to center of the top surface 21. In alternative embodiments of the present invention, the LED assembly 60 can be replaced by other semiconductor circuits or chips.

The traces 22 and 24 provide electrical routes to allow the LED assembly 60 to electrically connect to the solder pads 26, 32, or 34. Accordingly, some of the traces are referred to as first traces 22, while other traces are referred to as second traces 24. In the illustrated embodiment, the mounting pad 28 includes portions of both the first traces 22 and the second traces 24. In the illustrated example, the LED assembly 60 is placed on the first trace 22 portion of the mounting pad 28 thereby making contact with the first trace 22. In the illustrated embodiment, a top of the LED assembly 60 and the second traces 24 are connected to each other via a bond wire 62. Depending on the construction and orientation of LED assembly 60, first traces 22 may provide anode (positive) connections and second traces 24 may comprise cathode (negative) connections for the LED assembly 60 (or vice versa).

The LED assembly 60 can include additional elements. For example, in FIGS. 1B and 2C, the LED assembly 60 is illustrated including an LED bond wire 62, an LED subassembly 64, and a light emitting diode (LED) 66. Such an LED subassembly 64 is known in the art and is illustrated for the purposes of discussing the invention and is not meant to be a limitation of the present invention. In the Figures, the LED assembly 60 is shown die-attached to the substrate 20. In alternative embodiments, the mounting pad 28 can be configured to allow flip-chip attachment of the LED assembly 60. Additionally, multiple LED assemblies can be mounted on the mounting pad 28. In alternative embodiments, the LED assembly 60 can be mounted over multiple traces. This is especially true if flip-chip technology is used.

Figures 2A, 2B:
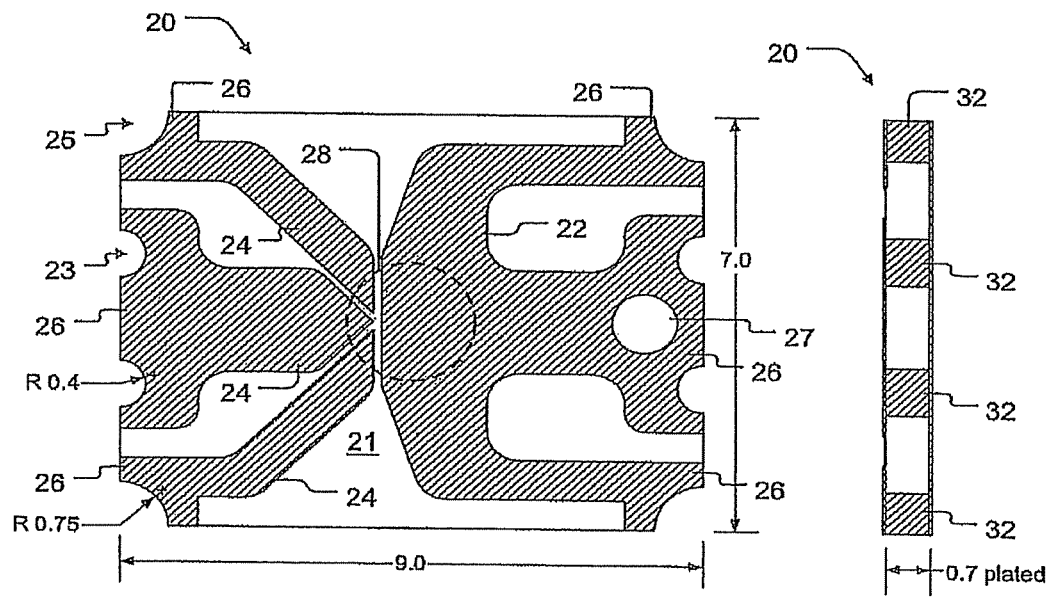
FIG. 2A is a top view of a portion of the semiconductor package of FIG. 1A.
FIG. 2B is a side view of a portion of the semiconductor package of FIG. 1A.

The topology of the traces 22 and 24 can vary widely from the topology illustrated in the Figures while still remaining within the scope of the example embodiments of the present invention. In the Figures, three separate cathode (negative) traces 24 are shown to illustrate that three LED assemblies can be placed on the mounting pad 28, each connected to a different cathode (negative) trace; thus, the three LED assemblies may be separately electrically controllable. The traces 22 and 24 are made of conductive material such as gold, silver, tin, or other metals. The traces 22 and 24 can have dimensions as illustrated in the Figures and are of a thickness on the order of microns or tens of microns, depending on application. In an example, the traces 22 and 24 can be 15 microns thick. FIGS. 1A and 2A illustrate an orientation marking 27. Such markings can be used to identify the proper orientation of the die package 10 even after assembling the die package 10. The traces 22 and 24, as illustrated, can extend from the mounting pad 28 to sides of the substrate 20.

Continuing to refer to FIGS. 1A through 2D, the substrate 20 defines semi-cylindrical spaces 23 and quarter-cylindrical spaces 25 proximal to its sides. In the Figures, to avoid clutter, only representative spaces 23 and 25 are indicated with reference numbers. The semi-cylindrical spaces 23 and the quarter-cylindrical spaces 25 provide spaces for solder to flow-through and solidify-in when the die package 10 is attached to a printed circuit board (PCB) or another apparatus (not shown) to which the die package 10 is a component thereof. Moreover, the semi-cylindrical spaces 23 and the quarter-cylindrical spaces 25 provide convenient delineation and break points during the manufacturing process.

The substrate 20 can be manufactured as one individual section of a strip or a plate having a plurality of adjacent sections, each section being a substrate 20. Alternatively, the substrate 20 can be manufactured as one individual section of an array of sections, the array having multiple rows and columns of adjacent sections. In this configuration, the semi-cylindrical spaces 23 and quarter-cylindrical spaces 25 can be utilized as tooling holes for the strip, the plate, or the array during the manufacturing process.

Furthermore, the semi-cylindrical spaces 23 and the quarter-cylindrical spaces 25, combined with scribed grooves or other etchings between the sections, assist in separating each individual substrate from the strip, the plate, or the wafer. The separation can be accomplished by introducing physical stress to the perforation (semi through holes at a close pitch) or scribe lines made by laser, or premolded, or etched lines (crossing the semi-cylindrical spaces 23 and the quarter-cylindrical spaces 25) by bending the strip, the plate, or the wafer. These features simplify the manufacturing process and thus reduce costs by eliminating the need for special carrier fixtures to handle individual unit of the substrate 20 during the manufacturing process. Furthermore, the semi-cylindrical spaces 23 and the quarter-cylindrical spaces 25 serve as via holes connecting the top solder pads 26, the side solder pads 32, and the bottom solder pads 34.

The substrate 20 has a bottom surface 29 including a thermal contact pad 36. The thermal contact pad 36 can be fabricated using a material having a high thermally and electrically conductive properties such as gold, silver, tin, or another material including but not limited to precious metals.

Figure 3:
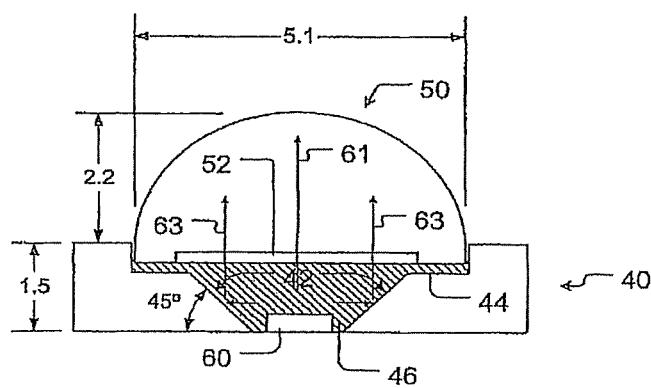
FIG. 3 is a cut-away side view of portions of the semiconductor package of FIG. 1A.

FIG. 3 illustrates a cut-away side view of portions of the semiconductor package of FIGS. 1A and 1B. In particular, the FIG. 3 illustrates a cut-away side view of the top heat sink 40 and the lens 50. Referring to FIGS. 1A, 1B, and 3, the top heat sink 40 is made from a material having high thermal conductivity such as aluminum, copper, ceramics, plastics, composites, or a combination of these materials. A high temperature, mechanically tough, dielectric material can be used to over-coat the traces 22 and 24 (with the exception of the central die-attach area) to seal the traces 22 and 24 and provide protection from physical and environmental harm such as scratches and oxidation. The overcoating process can be a part of the substrate manufacturing process. The overcoat, when used, may insulate the substrate 20 from the top heat sink 40. The overcoat may then be covered with a high temperature adhesive such as thermal interface material manufactured by THERMOSET that bonds the substrate 20 to the top heat sink 40.

Figure 2C:
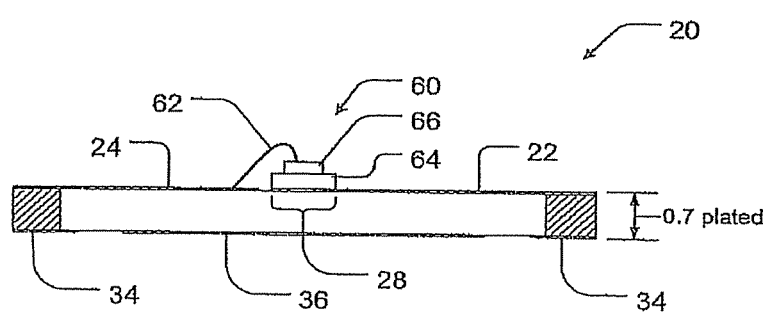
FIG. 2C is a front view of a portion of the semiconductor package of FIG. 1A.
Figure 2D:
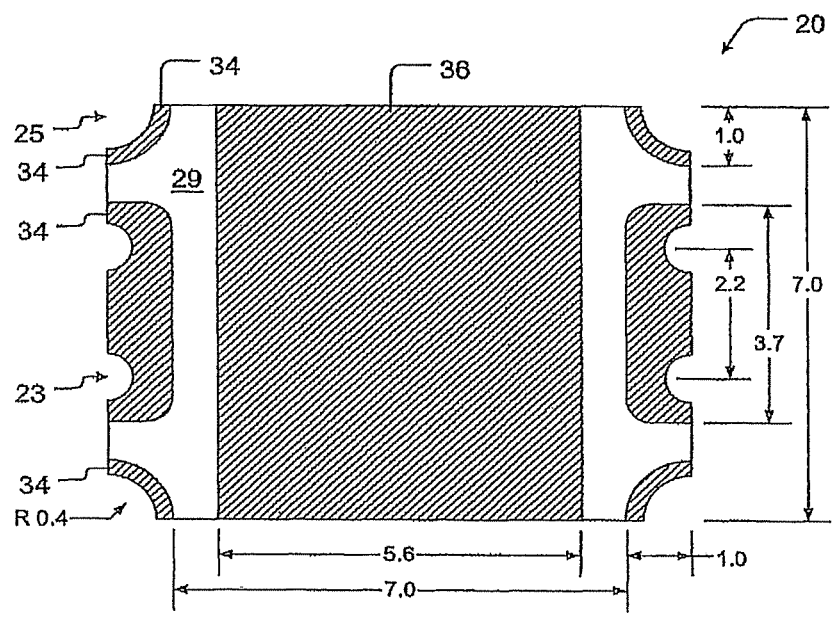
FIG. 2D is a bottom view of a portion of the semiconductor package of FIG. 1A.

The top heat sink 40 may include a reflective surface 42 substantially surrounding the LED assembly 60 mounted on the mounting pad 28 (of FIGS. 2A and 2C). When the top heat sink 40 is used to dissipate heat generated by the LED in the die package 10, it can be "top-mounted" directly onto an external heat sink by an adhesive or solder joint to dissipate heat efficiently. In another embodiment, if heat has to be dissipated by either a compressible or non-compressible medium such as air or cooling fluid, the top heat sink 40 may be equipped with cooling fins or any feature that will enhance heat transfer between the top heat sink 40 and the cooling medium. In both of these embodiments, the electrical terminals and the bottom heat sink 20 of the die package 10 can still be connected to its application printed circuit board (PCB) using, for example, the normal surface-mount-technology (SMT) method.

The reflective surface 42 reflects portions of light from the LED assembly 60 as illustrated by sample light rays 63. Other portions of the light are not reflected by the reflective surface 42 as illustrated by sample light ray 61. Illustrative light rays 61 and 63 are not meant to represent light traces often use in the optical arts. For efficient reflection of the light, the top heat sink 40 is preferably made from material that can be polished, coined, molded, or any combination of these. Alternatively, to achieve high reflectivity, the optical reflective surface 42 or the entire heat sink 40 can be plated or deposited with high reflective material such as silver, aluminum, or any substance that serves the purpose. For this reason, the top heat sink 40 is also referred to as a reflector plate 40. The reflector plate 40 is made of material having high thermal conductivity if and when required by the thermal performance of the package 10.

In the illustrated embodiment, the reflective surface 42 is illustrated as a flat surface at an angle, for example 45 degrees, relative to the reflective plate's horizontal plane. The example embodiments are not limited to the illustrated embodiment. For example, the reflective surface 42 can be at a different angle relative to the reflective plate's horizontal plane. Alternatively, the reflective plate can have a parabolic, toroid or any other shape that helps to meet the desired spectral luminous performance of the package.

The reflective plate 40 includes a ledge 44 for supporting and coupling with the lens 50. The LED assembly 60 is encapsulated within the die package 10 (of FIGS. 1A and 1B) using encapsulation material 46 such as, for example only, soft and elastic silicones or polymers. The encapsulation material 46 can be a high temperature polymer with high light transmissivity and refractive index that matches or closely matches refractive index of the lens 50, for example. The encapsulant 46 is not affected by most wavelengths that alter its light transmissivity or clarity.

The lens 50 is made from material having high light transmissivity such as, for example only, glass, quartz, high temperature and transparent plastic, or a combination of these materials. The lens 50 is placed on top of and adheres to the encapsulation material 46. The lens 50 is not rigidly bonded to the reflector 40. This "floating lens" design enables the encapsulant 46 to expand and contract under high and low temperature conditions without difficulty.

For instance, when the die package 10 is operating or being subjected to a high temperature environment, the encapsulant 46 experiences greater volumetric expansion than the cavity space that contains it. By allowing the lens 50 to float up somewhat freely on top of the encapsulant 46, no encapsulant will be squeezed out of its cavity space. Likewise, when the die package 10 is subjected to a cold temperature, the encapsulant 46 will contract more than the other components that make up the cavity space for the encapsulant 46; the lens will float freely on top of the encapsulant 46 as the latter shrinks and its level drops. Hence, the reliability of the die package 10 is maintained over relatively large temperature ranges as the thermal stresses induced on the encapsulant 46 is reduced by the floating lens design.

In some embodiments, the lens 50 defines a recess 52 (See FIG. 3) having a curved, hemispherical, or other geometry, which can be filled with optical materials intended to influence or change the nature of the light emitted by the LED chip(s) before it leaves the die package 10. Examples of one type of optical materials include luminescence converting phosphors, dyes, fluorescent polymers or other materials which absorb some of the light emitted by the chip(s) and re-emit light of different wavelengths. Examples of another type of optical materials include light diffusants such as calcium carbonate, scattering particles (such as Titanium oxides) or voids which disperse or scatter light. Any one or a combination of the above materials can be applied on the lens 50 to obtain certain spectral luminous performance.

Figure 4:
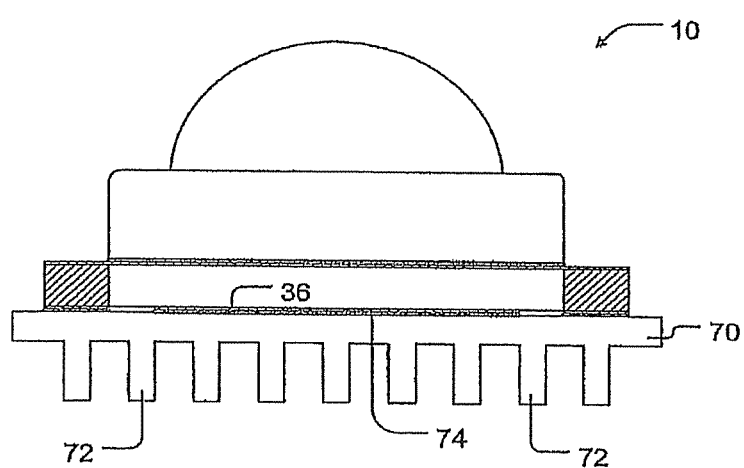
FIG. 4 is a side view of the semiconductor package of FIG. 1A with additional elements.

FIG. 4 illustrates the die package 10 coupled to an external heat sink 70. Referring to FIG. 4, the thermal contact pad 36 can be attached to the external heat sink 70 using epoxy, solder, or any other thermally conductive adhesive, electrically conductive adhesive, or thermally and electrically conductive adhesive 74. The external heat sink 70 can be a printed circuit board (PCB) or other structure that draws heat from the die package 10. The external heat sink can include circuit elements (not shown) or heat dissipation fins 72 in various configurations.

Figure 5:
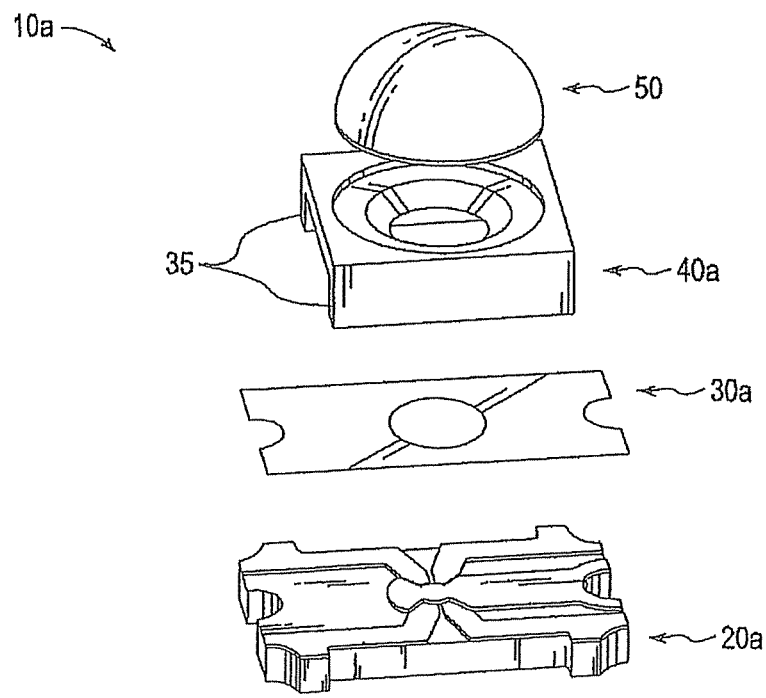
FIG. 5 an exploded perspective view of a semiconductor die package according to another embodiment of the present invention.

An example embodiment having an alternate configuration is shown in FIGS. 5 through 6D. Portions of this second embodiment are similar to corresponding portions of the first embodiment illustrated in FIGS. 1A through 4. For convenience, portions of the second embodiment as illustrated in FIGS. 5 through 6D that are similar to portions of the first embodiment are assigned the same reference numerals, analogous but changed portions are assigned the same reference numerals accompanied by letter "a," and different portions are assigned different reference numerals.

FIG. 5 is an exploded perspective view of an LED die package 10a in accordance with other embodiments of the present invention. Referring to FIG. 5, the light emitting die package 10a of the present invention includes a bottom heat sink (substrate) 20a, a top heat sink (reflector plate) 40a, and a lens 50.

FIGS. 6A, 6B, 6C, and 6D, provide, respectively, a top view, a side view, a front view, and a bottom view of the substrate 20a of FIG. 5. Referring to FIGS. 5 through 6D, the substrate 20a includes one first trace 22a and four second traces 24a. Traces 22a and 24a are configured differently than traces 22 and 24 of FIG. 2A. The substrate 20a includes flanges 31 that define latch spaces 33 for reception of legs 35 of the reflector plate 40a, thereby mechanically engaging the reflector plate 40a with the substrate 20a.

Additional example embodiments are illustrated in FIGS. 7A through 10B. According to these embodiments, a substrate for a high power light emitting device includes a thermally and electrically conductive plate having first and second surfaces. The plate may comprise a metal such as copper, aluminum or alloys of either. A thin, thermally conductive insulating film is formed on the first surface of the metal plate. In some embodiments, the thermally conductive insulating film comprises a ceramic/polymer film such as the Thermal Clad film available from by The Bergquist Company of Chanhassen, Minn., USA.

Conductive elements such as metal traces and/or metal leads may be formed on the ceramic/polymer film. Since the ceramic/polymer film is insulating, the conductive traces are not in electrical contact with the metal plate. A conductive element may form or be electrically connected to a mounting pad adapted to receive an electronic device. As discussed above in connection with the embodiments illustrated in FIGS. 1-6, the topology of the metal traces may vary widely while still remaining within the scope of the example embodiments.

An LED assembly may be bonded to the mounting pad for example by means of soldering, thermo-sonic bonding or thermo-compression bonding. Heat generated by the LED may be dissipated at least in part through the metal plate. Since the substrate itself may act as a heat sink, the need for bonding an additional heat sink to the structure may be reduced or eliminated. However, an additional heat sink may be placed in thermal communication with the metal plate so that heat may be drawn away from the operating device more efficiently.

In one embodiment, one or more via holes may be formed through the insulating film and the metal plate. The via holes may be internally coated with an insulating material such as the ceramic/polymer film. Electrical conductors such as electrically conductive traces may be formed in the via hole to electrically connect conductive elements on the first surface of the substrate to conductive elements on the second surface of the substrate. A substrate according to such an embodiment may be mounted on a surface such as a printed circuit board without the use of metal leads, which may result in a more mechanically robust package.

A substrate according to example embodiments may also include electronic circuitry such as a discrete zener diode and/or a resistor network for electrostatic discharge (ESD) and/or over-voltage protection.

Although not illustrated in FIGS. 7-10, the substrate may further include features such as the semi-cylindrical and quarter-cylindrical spaces, orientation markings, side bond pads, flanges and other features illustrated in FIGS. 1-6.

Portions of the embodiments illustrated in FIGS. 7A through 10B are similar to corresponding portions of the embodiments illustrated in FIGS. 1 through 6D. For convenience, portions of the embodiment as illustrated in FIGS. 7A through 10B that are similar to portions of the first embodiment are assigned the same reference numerals, analogous but changed portions are assigned the same reference numerals accompanied by letter "b," and different portions are assigned different reference numerals.

Figure 7A:
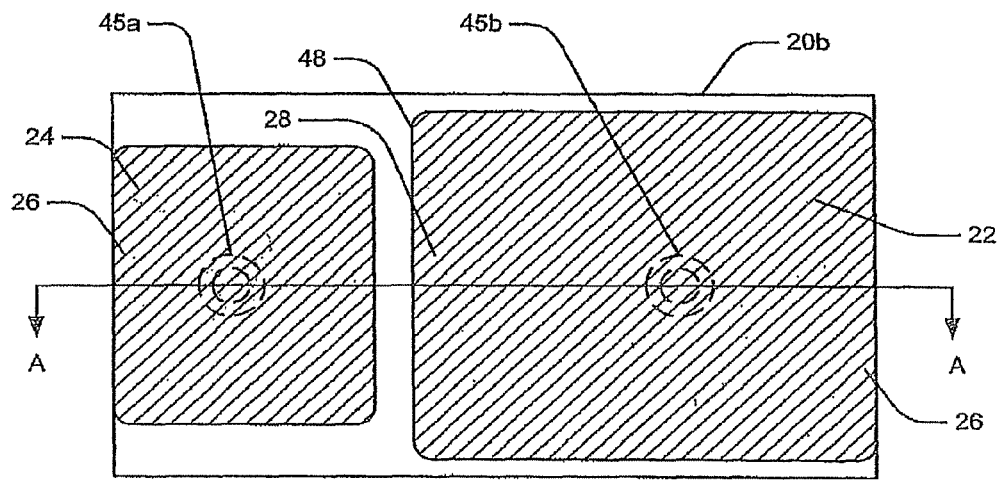
FIG. 7A is a top view of a portion of a semiconductor package according to another example embodiment.
Figure 7B:
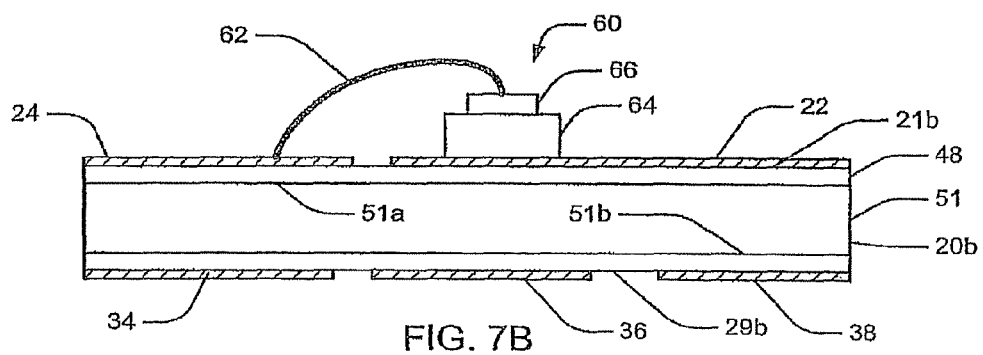
FIG. 7B is a front view of the portion of a semiconductor package of FIG. 7A.

Referring now to FIG. 7A, a substrate 20b according to another embodiments of the present invention is illustrated. FIGS. 7A and 7B provide, respectively, a top view and a front view of the substrate 20b. Further, FIG. 7B also shows an LED assembly 60 in addition to the front view of the substrate 20b. The substrate 20b includes a thermally and electrically conductive plate 51 having first and second surfaces 51a and 51b. The plate 51 may comprise a metal such as copper, aluminum or alloys of either. A thin, thermally conductive insulating film 48 is formed on at least portions of the first surface 51a of the metal plate 51. In some embodiments, the thermally conductive insulating film 48 comprises a ceramic/polymer film such as the Thermal Clad film available from by The Bergquist Company of Chanhassen, Minn., USA. In addition, a thermally conductive insulating film 49 may be formed on the second surface 51b of plate 51, as well as side surfaces.

The substrate 20b provides support for electrically conductive elements such as electrical traces 22 and 24; for solder pads 26; and for the LED assembly 60. Further, additional traces and connections can be fabricated on the top, side, or bottom of the substrate 20b, or layered within the substrate 20b. The traces 22 and 24, the solder pads 26, and any other connections can be interconnected to each other in any combinations using known methods, for example via holes.

The substrate 20b has a top surface 21b, the top surface 21b including the electrical traces 22 and 24. The traces 22 and 24 provide electrical connections from the solder pads (for example top solder pads 26) to a mounting pad 28. The top solder pads 26 may comprise portions of the traces 22 and 24 generally proximal to sides of the substrate 20b. The mounting pad 28 is a portion of the top surface (including portions of the trace 22, the trace 24, or both) where the LED assembly 60 is mounted. Typically the mounting pad 28 is generally located proximal to center of the top surface 21b. In alternative embodiments of the present invention, the LED assembly 60 can be replaced by other semiconductor circuits or chips.

The topology of the traces 22 and 24 can vary widely from the topology illustrated in the Figures while still remaining within the scope of the example embodiments. In the Figures, only one cathode (negative) and one anode (positive) trace is shown. However, multiple cathode or anode traces may be included on the substrate 20b to facilitate the mounting of plural LED assemblies on the mounting pad 28, each connected to a different cathode or anode trace; thus, the three LED assemblies may be separately electrically controllable. The traces 22 and 24 are made of conductive material such as gold, silver, tin, or other metals.

The substrate 20b has a bottom surface 29b including a thermal contact pad 36. The thermal contact pad can be fabricated using material having high heat conductivity such as gold, silver, tin, or other material including but not limited to precious metals.

Figure 7C:
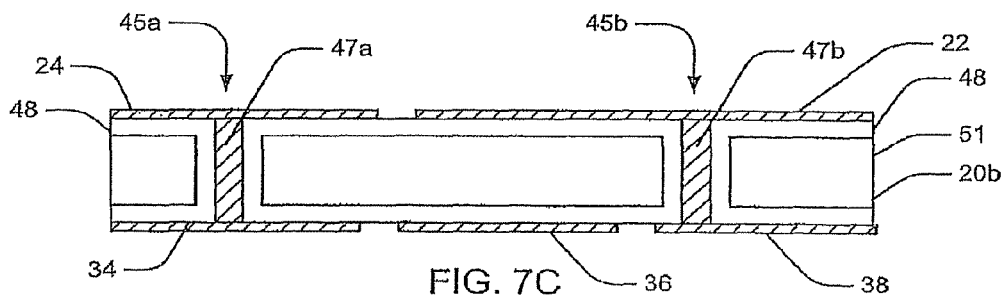
FIG. 7C is a cut-away front view of the portion of a semiconductor package of FIG. 7A taken along line A-A.

FIG. 7C illustrates a cut-away front view of portions of the substrate 20b taken along section line A-A of FIG. 7A. As shown in FIG. 7C, one or more via holes 45a, 45b may be formed through the substrate 20b. The via holes 45a, 45b may be internally coated with an insulating material such as the ceramic/polymer film. Electrical conductors such as electrically conductive traces 47a, 47b may be formed in the via holes and may electrically connect conductive elements on the first surface of the substrate to conductive elements on the second surface of the substrate. As illustrated in FIG. 7C, a conductive trace 47a in via hole 45a connects, trace 24 on the first side 21b, or the top surface 21b, of the substrate 20b to solder pad 34 on the second side 29b, or the bottom surface 29b, of the substrate 20b. Likewise, a conductive trace 47b extending through via hole 45b connects conductive trace 22 to a bond pad 38.

A substrate according to such an embodiment may be mounted on a surface such as a printed circuit board without the use of metal leads, which may result in a more mechanically robust package.

As discussed above, a high temperature, mechanically tough, dielectric material can be used to overcoat the traces 22 and 24 (with the exception of the central die-attach area 28) to seal the traces 22 and 24 and provide protection from physical and environmental harm such as scratches and oxidation. The overcoating process can be a part of the substrate manufacturing process. The overcoat, when used, also insulates the traces 22 and 24 from the top heat sink 40. The overcoat may then be covered with a high temperature adhesive such as thermal interface material manufactured by THERMOSET that bonds the substrate 20b with the top heat sink 40.

Figure 8:
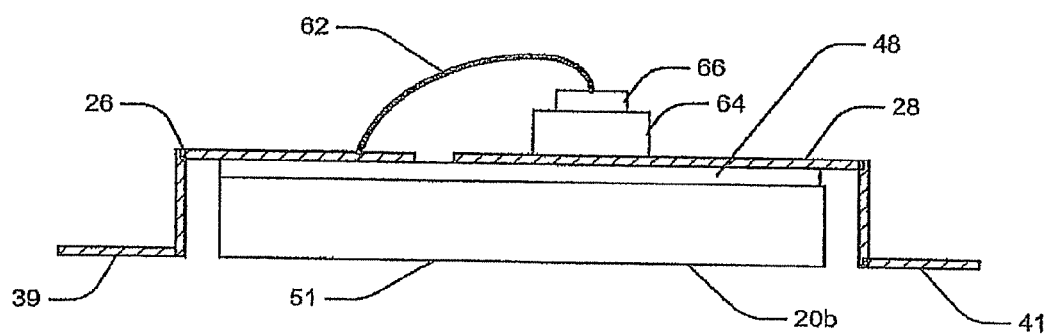
FIG. 8 is a side view of a portion of a semiconductor package according to another example embodiment.
Figure 9:
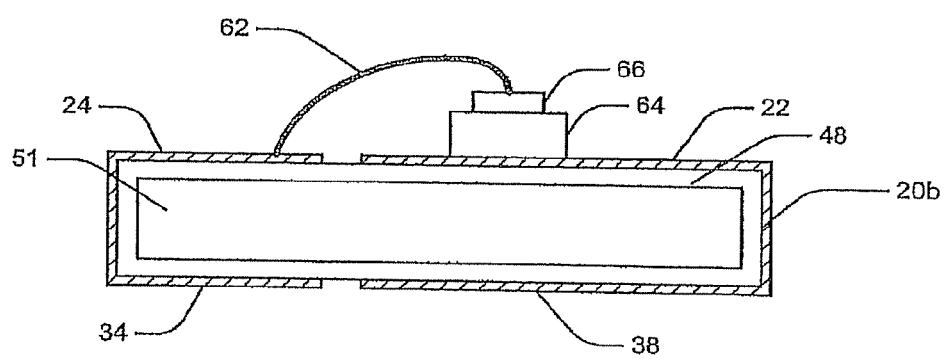
FIG. 9 is a side view of a portion of a semiconductor package according to another example embodiment.

Other embodiments that do not utilize via holes are illustrated in FIGS. 8 and 9. As illustrated in FIG. 8, the conductive traces 22, 24 may form or be attached to metal leads 39, 41 which extend away from the package and which may be mounted directly to a circuit board. In such an embodiment, only the first surface 21b of the substrate 20b may include an electrically insulating, thermally conductive film 48.

FIG. 9 illustrates an embodiment in which conductive traces 22, 24 extend down the sidewalls of the substrate 20b to contact bond pads 34 and 38 on the second surface of the substrate 20b. Such a configuration may permit the package to be mounted directly onto a circuit board without the use of metal leads or via holes.

Figure 10A:
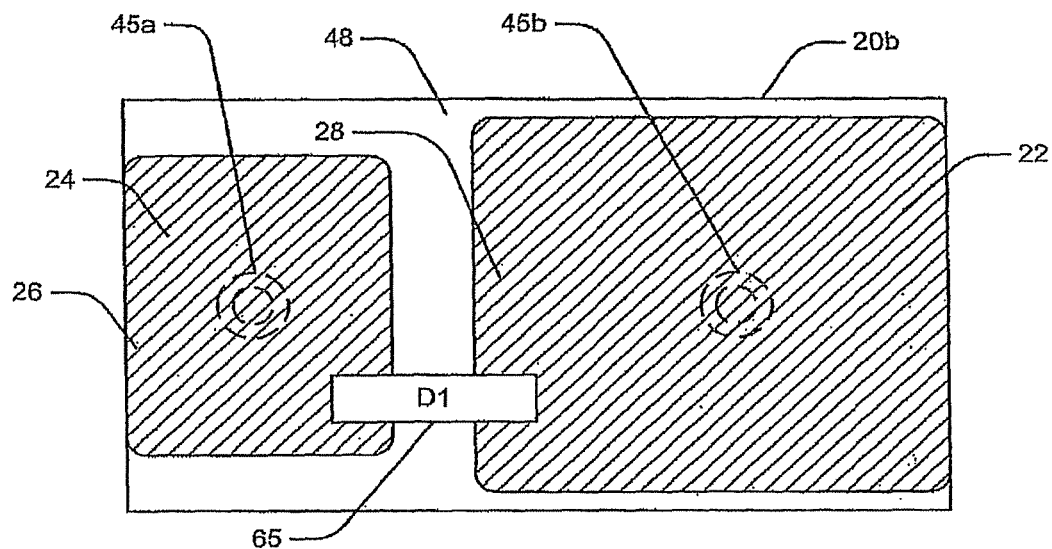
FIG. 10A is a top view of a portion of a semiconductor package according to another example embodiment.
Figure 10B:
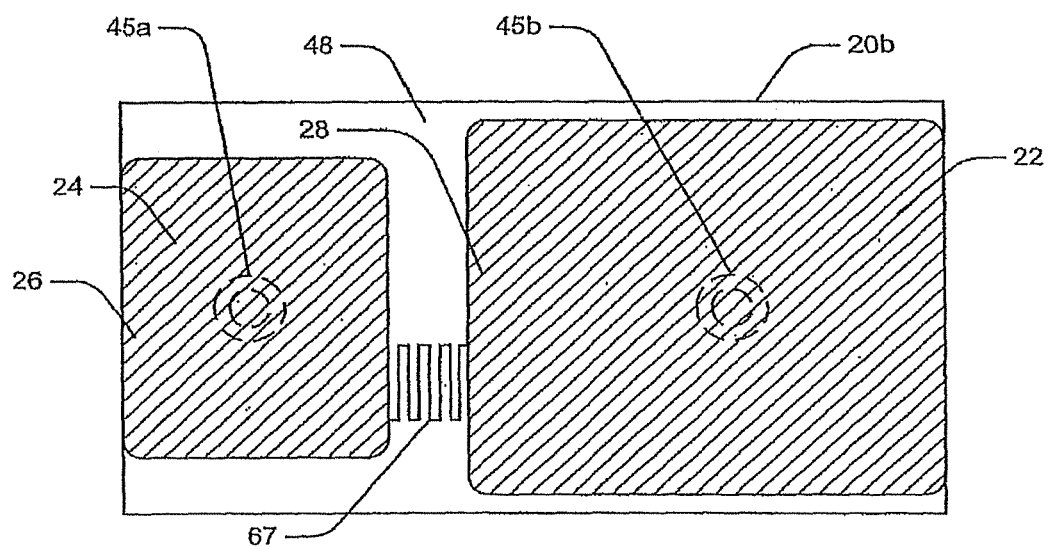
FIG. 10B is a top view of a portion of a semiconductor package according to another example embodiment.

As illustrated in FIGS. 10A and 10B, the substrate 20b may be configured to include electronic circuitry such as a discrete zener 65 diode, a resistor network 67, other electronic elements, or any combination of these. Such electronic circuitry can be connected between the traces 22 and 24 which may operate as anode/or cathode elements. The electronic circuitry can be used for various purposes, for example, to prevent electrostatic discharge (ESD), for over-voltage protection, or both. In the illustrated examples, the zener diode D1 65 connected between the trace 22 and the trace 24 as illustrated in FIG. 10B may prevent an excessive reverse voltage from being applied to an optoelectronic device mounted on the substrate 20*b*. Similarly, the resistor network 67 such as printed resistor 67 may provide ESD protection to a device mounted on the substrate 20.

The example embodiments of the present invention being thus described, it will be obvious that the same may be varied in many ways. Such variations are not to be regarded as a departure from the exemplary embodiments of the present invention, and all such modifications as would be obvious to one skilled in the art are intended to be included within the scope of the following claims.

What is claimed is:

1. A light emitting die package, comprising:
a substrate having a first surface;
a first conductive lead on the first surface that is insulated from the substrate by an insulating film, the first conductive lead forming a mounting pad for mounting a light emitting device;
a lead electrically connected to the first conductive lead and extending away from the first surface; and
a reflective surface disposed on the first surface of the substrate at least partially on top of the first conductive lead, the reflective surface substantially surrounding the mounting pad while leaving other portions of the first surface of the substrate and portions of the first conductive lead exposed.

2. The package of claim 1, further comprising:
a second conductive lead, and a light emitting diode (LED) mounted on the substrate and connected to the first and second conductive leads.

3. The package of claim 2, wherein the LED is encapsulated within optically clear polymer.

4. The package of claim 1, wherein the substrate comprises a metal selected from the group consisting of copper, aluminum and a copper/aluminum alloy.

5. The package of claim 1, wherein the insulating film comprises a ceramic polymer film.

6. The package of claim 2, wherein the substrate comprises a second surface opposite the first surface, and further comprising at least one via hole through the substrate.

7. The package of claim 6, wherein a surface of the via hole is coated with an insulating film coating.

8. The package of claim 6, wherein the via hole includes a conductive trace there through, the conductive trace being insulated from the substrate by the insulating film coating, being in electrical contact with one of the first and second conductive leads.

9. The package of claim 1, wherein the lead electrically connected to the first conductive lead extends away from the mounting pad and around a side of the substrate.

10. The package of claim 1, wherein the reflective surface is disposed on a reflector that comprises at least one leg mechanically engaging the substrate for increased thermal transfer.

11. The package of claim 1, wherein the substrate comprises flanges along at least one side for mechanically engaging a reflector on which the reflective surface resides.

12. The package of claim 1, wherein the reflective surface comprises a material having high thermal conductivity.

13. The package of claim 1, further comprising:
a lens substantially covering the mounting pad.

14. The package of claim 13, wherein the lens comprises a trough adapted to receive optical chemicals.

15. The package of claim 13, wherein the lens comprises materials selected from the group consisting of frequency shifting compounds, a diffusant, and a phosphor.

16. A light emitting die package comprising:
a substrate;
a first conductive element on the substrate;
a second conductive element on the substrate, the second conductive element spaced apart from the first conductive element and at least one of the first and second conductive elements comprising a mounting pad for mounting a light emitting die thereon;
a reflective surface coupled to the substrate and substantially surrounding the mounting pad and the reflective surface comprising a ledge; and
an encapsulation material comprising an optically clear polymer for encapsulating the light emitting die, the encapsulation material residing within the reflective surface over the mounting pad and ledge; and
a lens substantially covering the mounting pad and resting on the encapsulation material above the ledge of the reflective surface.

17. The light emitting die package of claim 16 further comprising a light emitting diode (LED) mounted on the substrate and connected to the first and second conductive elements.

18. The light emitting die package of claim 16, wherein the first and second conductive elements comprise metal traces.

19. The light emitting die package of claim 16, wherein the substrate comprises a metal selected from the group consisting of copper and aluminum.

20. The light emitting die package of claim 16, wherein the substrate comprises a metal consisting of a copper/aluminum alloy.

21. The light emitting die package of claim 16, wherein the substrate comprises a second surface opposite the first surface, and further comprising at least one via hole through the substrate.

22. The light emitting die package of claim 16, wherein the surface of the via hole is coated with an insulating film coating.

23. The light emitting die package of claim 22, wherein the via hole comprises a conductive trace therethrough, the conductive trace is insulated from the substrate by the insulating film coating, and the conductive trace is in electrical contact with one of the first and second conductive elements.

24. The light emitting die package of claim 23, wherein the second surface of the substrate comprises a thermally conductive insulating film on at least a portion of the second surface and wherein the package further comprises a third conductive element on the second surface, the third conductive element is insulated from the substrate by the thermally conductive insulating film, and the third conductive element is in electrical contact with the conductive trace through the via hole.

25. The light emitting die package of claim 16, further comprising an external heat sink coupled to the substrate.

26. The light emitting die package of claim 25, wherein the substrate has a bottom side plated with metals for coupling with the external heat sink.

27. The light emitting die package of claim 16, wherein at least one conductive element extends from the mounting pad to a side of the substrate.

28. The light emitting die package of claim 16, wherein the reflective surface resides on a reflector that is coupled to the substrate.

29. The light emitting die package of claim 28, wherein the substrate comprises flanges along at least one side for mechanically engaging the reflector.

30. The light emitting die package of claim 28, wherein the reflector comprises a material selected from the group consisting of aluminum, copper, ceramics and plastics.

31. The light emitting die package of claim 28, wherein the reflector comprises at least one leg mechanically engaging the substrate for increased thermal transfer.

32. The light emitting die package of claim 16, wherein the lens comprises diffusant.

33. The light emitting die package of claim 16, wherein the lens comprises a phosphor.

* * * * *